United States Patent
Zangooie et al.

(10) Patent No.: US 8,411,270 B2
(45) Date of Patent: Apr. 2, 2013

(54) MONITORING STAGE ALIGNMENT AND RELATED STAGE AND CALIBRATION TARGET

(75) Inventors: Shahin Zangooie, Hopewell Junction, NY (US); Lin Zhou, LaGrangeville, NY (US); Roger M. Young, Warwick, NY (US); Clemente Bottini, Marlboro, NY (US); Ronald D. Fiege, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1254 days.

(21) Appl. No.: 12/015,789

(22) Filed: Jan. 17, 2008

(65) Prior Publication Data

US 2009/0185183 A1 Jul. 23, 2009

(51) Int. Cl.
*G01B 11/00* (2006.01)

(52) U.S. Cl. ........ 356/399; 356/401; 356/369; 356/400; 250/491.1

(58) Field of Classification Search .......... 356/399–401; 250/491.1

See application file for complete search history.

(56) References Cited

U.S. PATENT DOCUMENTS

| 5,144,363 | A | * | 9/1992 | Wittekoek et al. | 355/53 |
| 5,894,341 | A | * | 4/1999 | Nishi et al. | 355/68 |
| 6,146,797 | A | | 11/2000 | Fujii | |
| 6,556,303 | B1 | * | 4/2003 | Rangarajan et al. | 356/446 |
| 6,627,903 | B1 | * | 9/2003 | Hirayanagi | 250/491.1 |
| 6,898,007 | B2 | | 5/2005 | Woo et al. | |
| 6,943,353 | B2 | | 9/2005 | Elmore et al. | |
| 7,067,763 | B2 | * | 6/2006 | Schramm | 219/121.69 |
| 7,742,160 | B2 | * | 6/2010 | Bottini et al. | 356/141.1 |
| 7,808,657 | B2 | * | 10/2010 | Zangooie et al. | 356/620 |
| 7,879,201 | B2 | * | 2/2011 | Druz et al. | 204/192.11 |
| 2005/0073743 | A1 | | 4/2005 | Weyh et al. | |
| 2005/0074204 | A1 | | 4/2005 | Wilson et al. | |

* cited by examiner

*Primary Examiner* — Tarifur Chowdhury
*Assistant Examiner* — Isiaka Akanbi
(74) *Attorney, Agent, or Firm* — Ian D. MacKinnon; Hoffman Warnick LLC

(57) ABSTRACT

Methods, apparatuses and systems for monitoring a stage alignment in a processing system are disclosed. A method for monitoring a stage alignment in a processing system may include providing a calibration target on a surface of the stage; measuring an angle of incident of a light beam to the calibration target; and monitoring the stage alignment based on the determined angle of incidence.

19 Claims, 9 Drawing Sheets

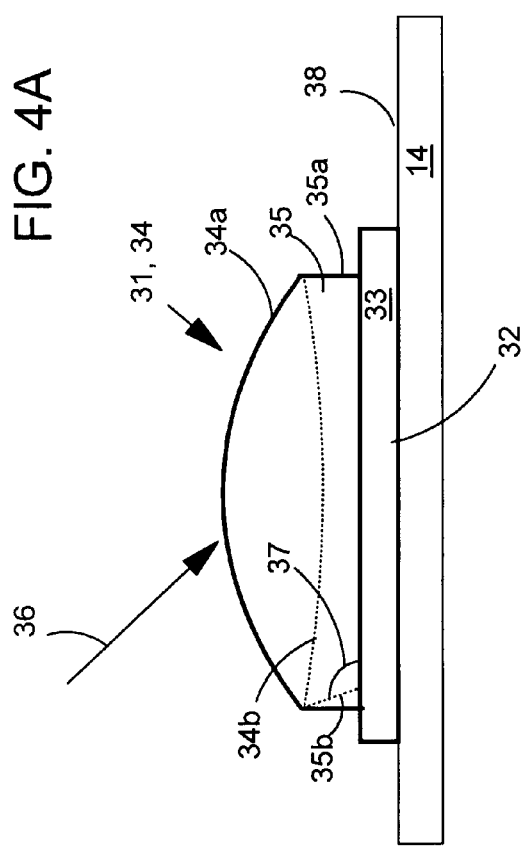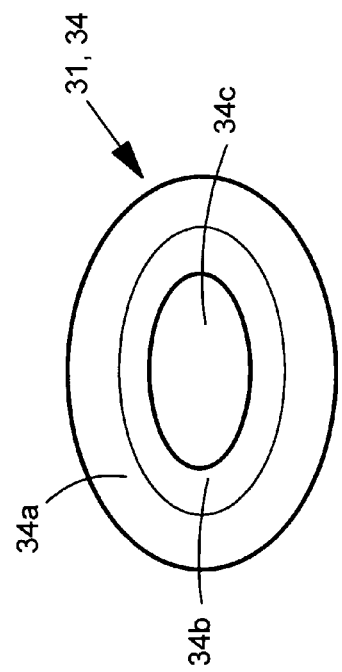

US 8,411,270 B2

MONITORING STAGE ALIGNMENT AND RELATED STAGE AND CALIBRATION TARGET

BACKGROUND OF THE DISCLOSURE

1. Technical Field

The present disclosure relates in general to a processing system, and more particularly to monitoring alignment of a stage in the processing system and the related calibration targets and stages.

2. Background Art

Utilization of optical metrology in semiconductor manufacturing has grown significantly over the past several years. The technology provides capabilities to conduct measurements of a wide variety of critical device parameters, including, for example, critical dimensions, depths and sidewall angles. The benefits of optical metrology include non-invasive and fast measurement capabilities with relatively low cost of ownership. The non-contact characteristic of the optical metrology is of great value because any time a contact is made to the surface of a device there is a possibility that the device could be damaged and/or contaminated. For optical metrology tools to yield measurement results that are matched, it is necessary that the optical metrology tools produce well defined incident light beams, and properly collect reflected light beams for analysis.

One critical parameter for an optical metrology measurement is the angle of incidence (AOI) of the produced light beam. AOI is often considered a fixed parameter in the majority of the optical metrology techniques. The AOI is characterized through a system calibration procedure which is accessed by the recipe/library during the calculations of the measurement results. Preferably prior to AOI characterization and calibration, stage alignment needs to be monitored and stage tilt (if any) needs to be corrected.

SUMMARY

A first aspect of the disclosure is directed to a method for monitoring a stage alignment in a processing system, the method comprising: providing a calibration target on a surface of the stage; measuring an angle of incidence of a light beam to the calibration target; and monitoring the stage alignment based on the determined angle of incidence.

A second aspect of the disclosure is directed to a stage in a processing system, the stage comprising: a calibration target embedded in the stage, the calibration target including a surface for exposure to an incident light beam that strikes on a surface of the stage.

A third aspect of the disclosure is directed to a calibration target comprising: an upper surface including a portion sensitive to a change of an angle of incidence of a light beam striking on the portion; and a lower surface which when interfacing with a surface of an object, translates a shape of the object surface into a relative position of the sensitive portion to the light beam.

A fourth aspect of the disclosure is directed to a system for monitoring a stage alignment in a processing system, the system comprising: a calibration target capable of being positioned on a surface of the stage; means for measuring an angle of incidence of a light beam to the calibration target; and means for monitoring the stage alignment based on the determined angle of incidence.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE DRAWINGS

The embodiments of this disclosure will be described in detail, with reference to the following figures, wherein like designations denote like elements, and wherein:

FIG. 4A shows, in a cross-section view, embodiments of a calibration target.

FIG. 4B shows, in a top view, embodiments of a calibration target.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION OF THE DISCLOSURE

The following detailed description of embodiments refers to the accompanying drawings, which illustrate specific embodiments of the disclosure. Other embodiments having different structures and operations do not depart from the scope of the present disclosure.

Figure 1:
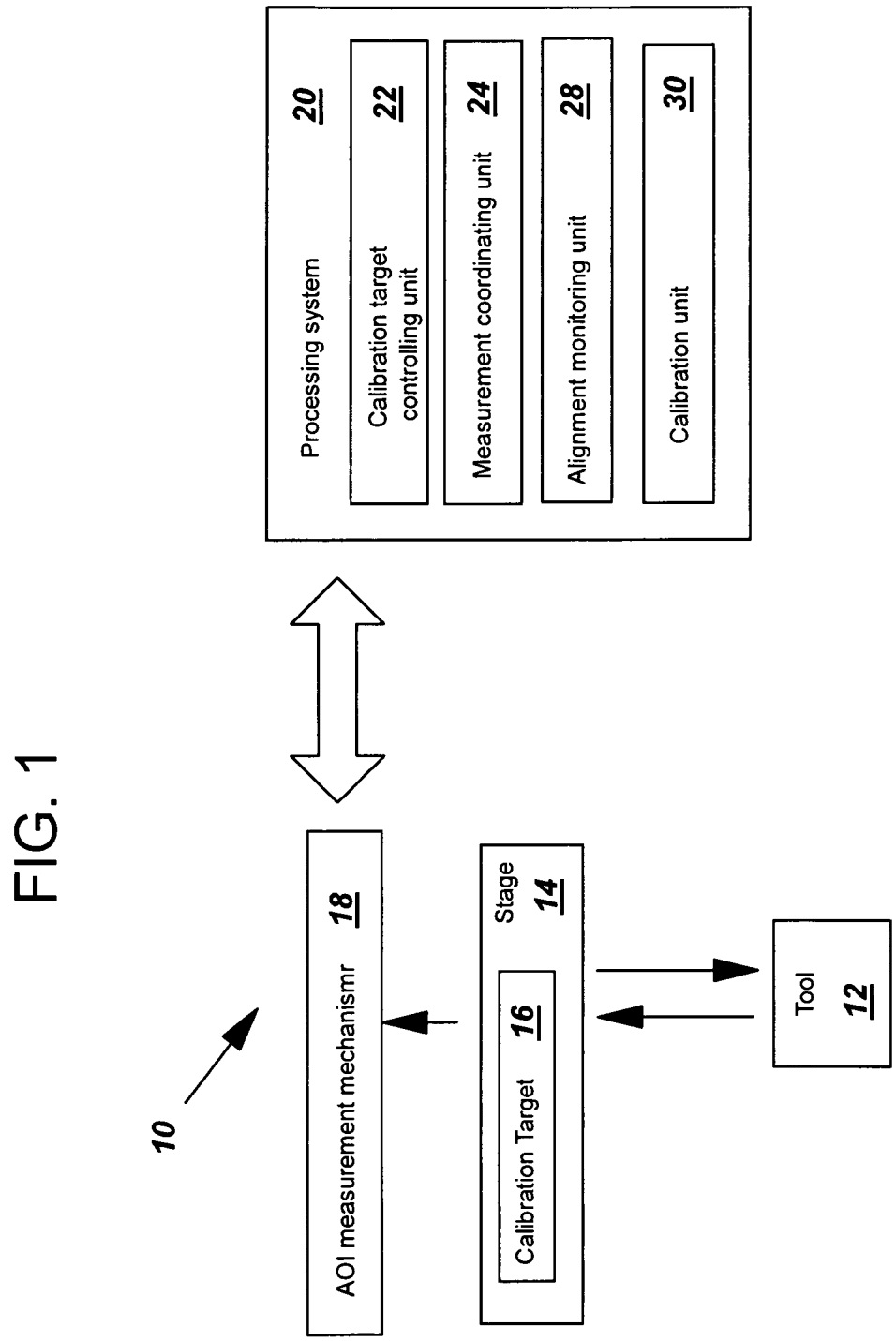
FIG. 1 shows a system.

FIG. 1 shows a block diagram of a system 10 according to an embodiment of the invention. System 10 includes an optical metrology tool (tool) 12, a stage 14, a calibration target 16 (optionally separated from stage 14), an AOI measurement mechanism 18 and a processing system 20. Processing system 20 includes a calibration target controlling unit 22, a measurement coordinating unit 24, an alignment monitoring unit 28, and a calibration unit 30.

According to an embodiment, processing system 20 may be implemented by a computer system. The computer system can comprise any general purpose computing article of manufacture capable of executing computer program code installed thereon to perform the process described herein. The computer system can also comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively. The operation of system 10 will be described herein in detail.

Figure 2:
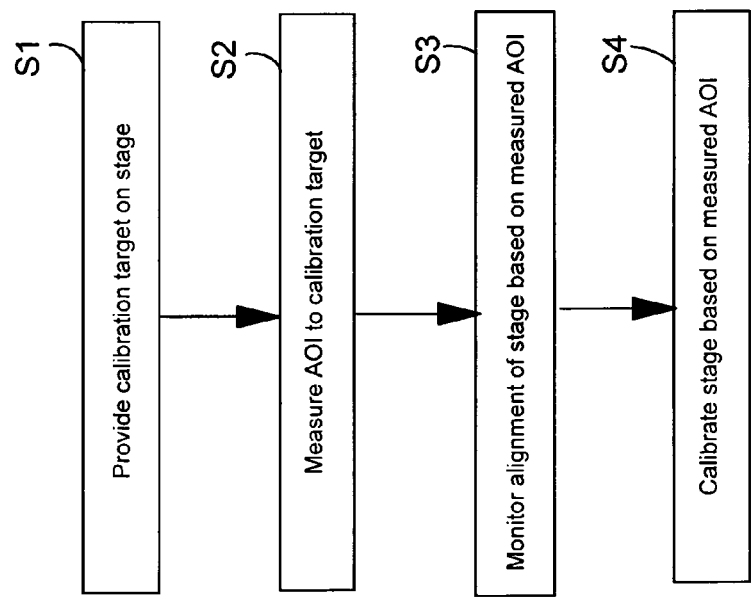
FIG. 2 shows embodiments of an operation of the system of FIG. 1.
Figure 3:
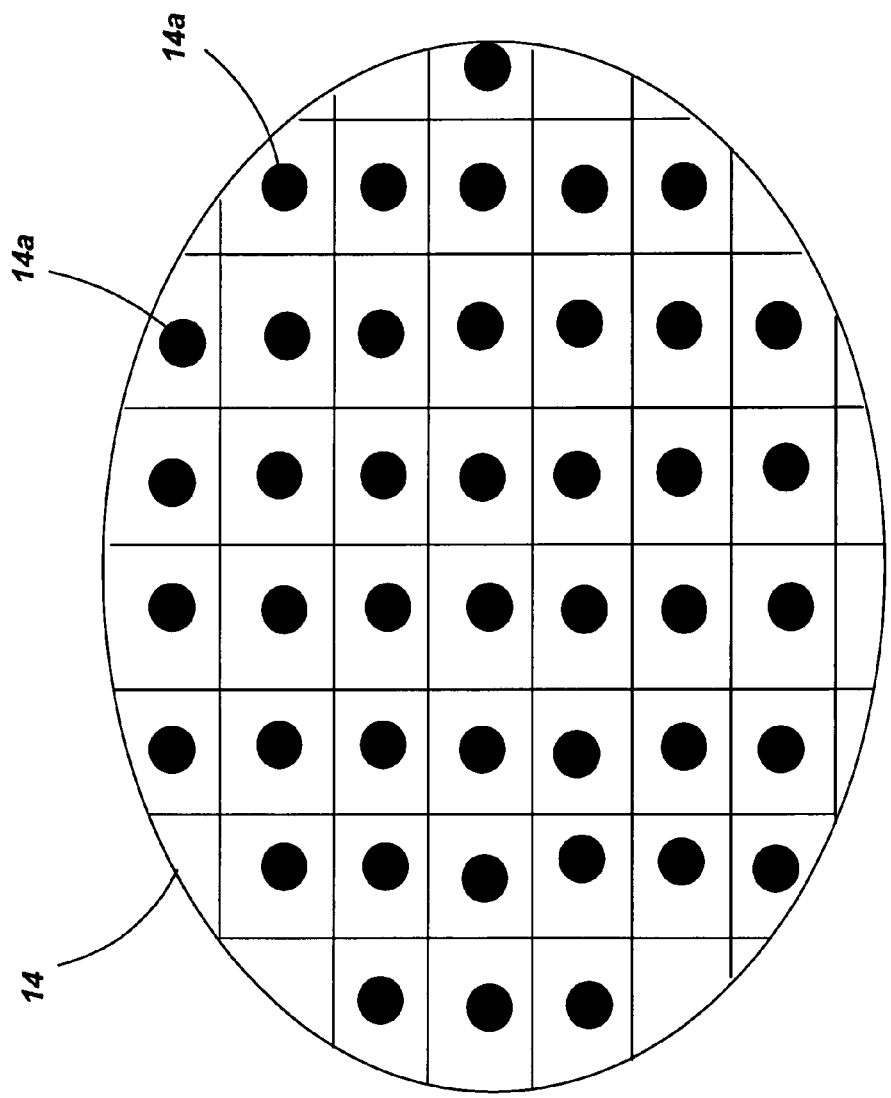
FIG. 3 shows embodiments of a grid on a stage surface.

FIG. 2 shows embodiments of an operation of system 10 in monitoring alignment of stage 14. Referring to FIGS. 1 and 2 collectively, in process S1, calibration target controlling unit 22 (optionally) provides calibration target 16 on the surface of stage 14. According to one embodiment, calibration target controlling unit 22 may provide calibration target 16 at different locations of the surface of stage 14 to determine AOIs at the different locations. For example, the different locations may constitute a grid throughout the surface of stage 14 as shown in FIG. 3. In FIG. 3, a calibration target 16 may be positioned at each location (grid point) 14a to measure the AOI thereto. As a consequence, the determined AOIs and stage 14 alignment on grid points 14a may constitute a finger print of stage 14 to be considered in the measurement (in analyzing the measurement results) of a wafer positioned on stage 14.

According to an embodiment, at a same location 14a calibration target controlling unit 22 may position calibration target 16 with different tilts such that, for example, the contribution of calibration target 16 tilts on the measured AOI may be reduced/eliminated, as will be described herein.

According to an embodiment, calibration target 16 may be designed to be sensitive to the variation of AOI. For example, as shown in FIG. 4A in a cross-sectional view, calibration target 16 may include an upper surface 31 and a lower surface 32. Upper surface 31 includes a portion 34 sensitive to a change of AOI of a light beam 36 striking on portion 34. Lower surface 32 is designed such that when it interfaces with a surface 38 of stage 14, lower surface 32 translates a shape of stage 14 surface 38 into a relative position of sensitive portion 34 to light beam 36. For example, lower surface 32 may be a part of a substrate 33 of calibration target 16. According to an embodiment, sensitive portion 34 may be one of a convex portion 34a (shown in solid lines), e.g., a domed portion, or a concave portion 34b (shown in dotted lines).

According to an alternative embodiment, as shown in FIG. 4B in a top view, sensitive portion 34 may include materials of different optical responses at different surface locations (areas). For example, areas 34a, 34b and 34c may include materials of different optical responses. As such, when AOI changes, incident beam 36 will strike on a different area of sensitive portion 34, e.g., from area 34a to area 34b, which causes a change in the optical response.

According to an embodiment, calibration target 16 may also include a cut-off portion 35 between upper surface 31 and lower surface 32. Cut-off portion 35 may induce a sharp change of AOI compared to the AOI to upper, sensitive portion 34. Such a sharp AOI change may reduce the edge effects in analyzing the obtained AOIs. Any approach may be used to achieve that an AOI to cut-off portion 35 be sharply different than an AOI to sensitive portion 34. For example, according to an embodiment, surface 35a of cut-off portion 35 is substantially perpendicular to stage 14 surface 38. According to another embodiment, surface 35b of cut-off portion 35 (indicated by dotted lines) may form an angle 37 larger than 90 degrees (angle 37 is defined as an anticlockwise degree less than 180 degree) with surface 38. According to a further embodiment, cut-off portion 35 may include an optical response substantially different than that of portion 34, for example, cut-off portion 35 is non-reflective compared to reflective portion 34.

Using calibration target 16 of FIGS. 4A and 4B, calibration target controlling unit 22 (FIG. 1) may scan calibration target 16 along surface 38 of stage 14 to detect the differences in measured AOIs, and alignment monitoring unit 28 may monitor the alignment of stage 14 based on the differences, as will be described herein.

Figure 5:
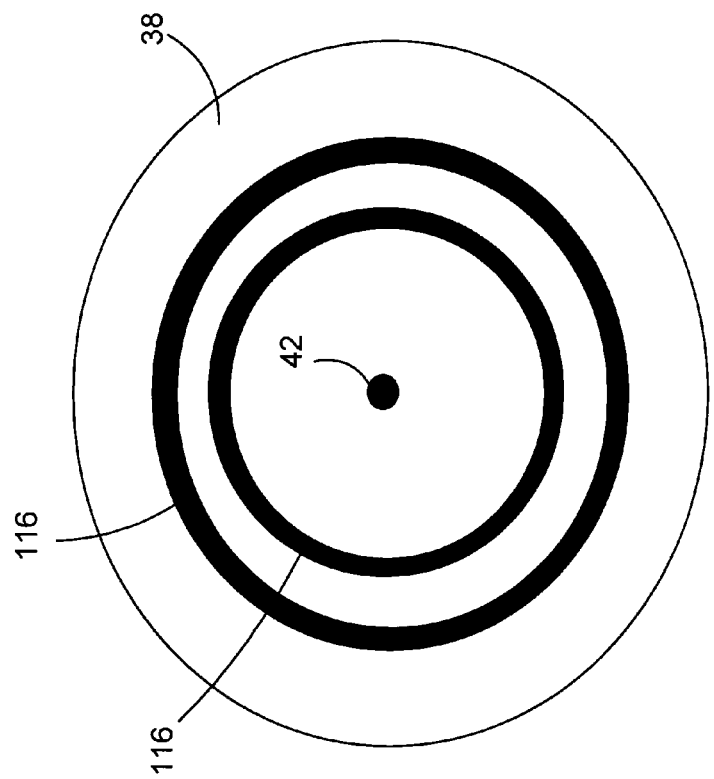
FIG. 5 shows, in a top view, embodiments of a stage with embedded calibration targets.

In the above embodiments, calibration target controlling unit 22 is involved in the process, which has been indicated as optional. According to an alternative embodiment, a calibration target 116 is embedded in stage 14, as shown in FIG. 5 in a top view. Stage 14 may include multiple embedded calibration targets 116 at different locations that constitute a grid similar as that shown in FIG. 3. According to an alternative embodiment, as shown in FIG. 5, calibration target 116 is substantially ring-shaped around a center 42 of stage 14 surface 38. Ring-shaped target 116 may be substantially centered at center 42. Note that the inner and outer borders of a "substantial ring" shape may be substantially circular or substantially oval. Stage 14 may further include multiple (two are shown in FIG. 5) ring-shaped embedded calibration targets 116, which according to an embodiment, may be substantially co-centered at center 42. As such, the co-centered ring-shaped calibration target 116 may function similarly as the grid-positioned calibration targets as shown in FIG. 3 in determining AOIs at different locations of stage 14. It should be appreciated that the above described ring-shape does not limit the shape of calibration target 116. Calibration target 16 may include other shapes, for example, a rectangular shape, as well.

Figure 6:
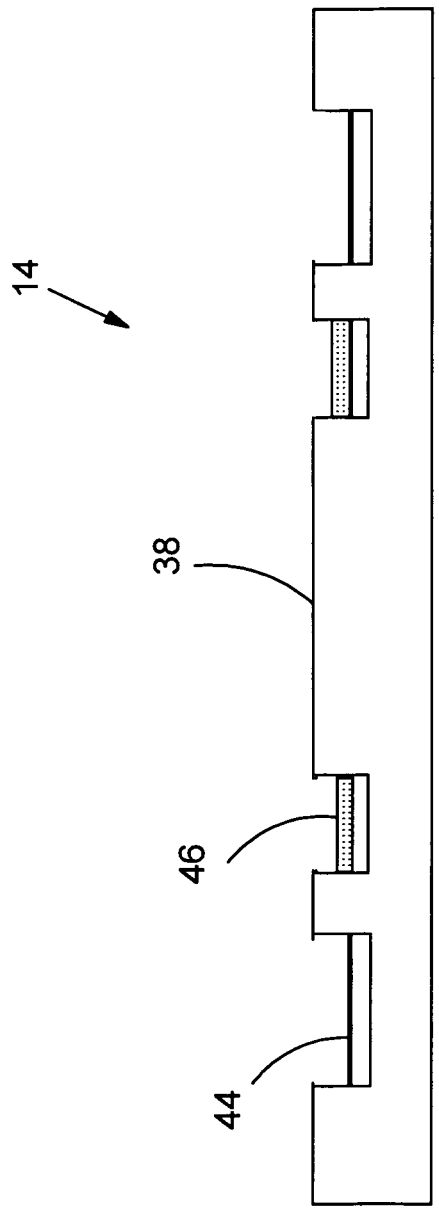
FIG. 6 shows, in a cross-sectional view, embodiments of a stage with embedded calibration targets.

Embedded calibration target 116 may include either a reflective material or a transparent material. According to an embodiment, as shown in a cross-sectional view in FIG. 6, a surface 44 of embedded calibration target 116 is lower than surface 38 of stage 14. In addition, surface 44 may be covered by a protective cover 46 of transparent material. These features help to protect embedded calibration target 116 from physical damages.

Figure 7:
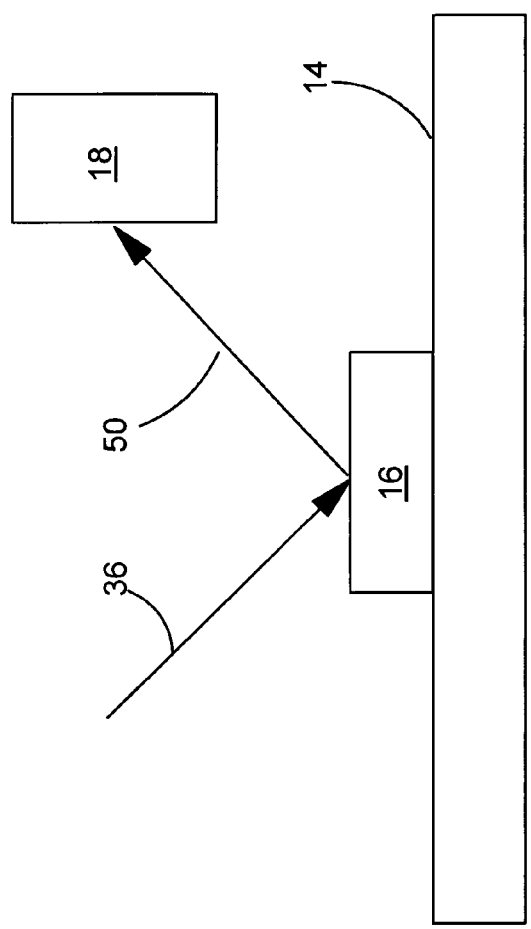
FIG. 7 shows an embodiment of measuring an angle of incidence on a separated calibration target in monitoring stage alignment.
Figure 8:
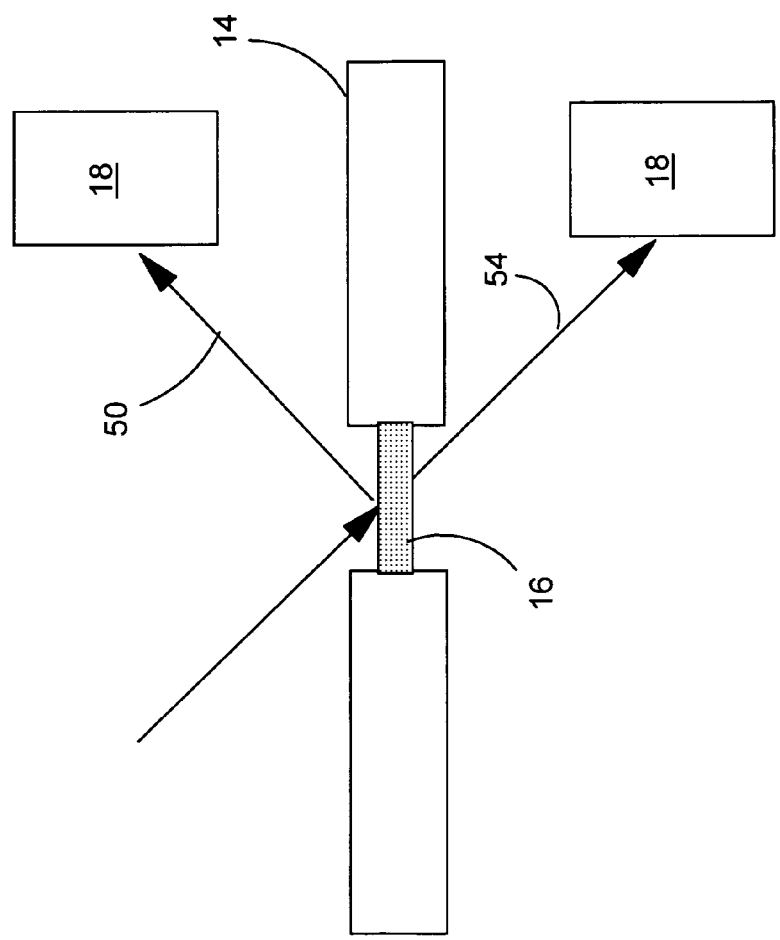
FIG. 8 shows embodiments of measuring an angle of incidence on an embedded calibration target in monitoring stage alignment.

Returning to FIGS. 1 and 2 collectively, in process S2, measurement coordinating unit 24 coordinates with AOI measurement mechanism 18 to measure an AOI(s) to calibration target 16, 116 at each location. As calibration target 16 may be positioned with multiple tilts at a same location, the AOIs with each of the tilts may be measured. Any method may be used in measuring the AOIs and all are included. Usually, AOI measurement mechanism 18 functions to measure at least one of a direction and an optical property of a light beam, and measurement coordinating unit 24 may function to analyze the measurement results to obtain the AOI. As shown in FIG. 7, for a separated calibration target 16 (as opposed to embedded calibration target 116) positioned on stage 14, AOI measurement mechanism 18 may detect the direction and/or optical property, e.g., optical intensity, of a reflected beam 50 from calibration target 16. As shown in FIG. 8, for an embedded calibration target 116, AOI measurement mechanism 18 may be positioned to measure the direction/position and/or optical property of one of a reflected beam 50 from the embedded calibration target 116 (where calibration target 116 is reflective) or a pass through beam 54 through embedded calibration target 116 (where calibration target 116 is at least partially transparent).

Returning to FIGS. 1 and 2, in process S3, alignment monitoring unit 28 monitors the stage alignment of stage 14 based on the measured AOIs. According one embodiment, alignment monitoring unit 28 may compare the measured AOI to the defined AOI of tool 12. A defined AOL is usually setup by the manufacturer of tool 12 or may be setup through a calibration of tool 12. As tool 12 parameters may usually be assumed as fixed in the stage alignment monitoring, all differences between the measured AOI and the defined AOI may be attributed to stage 14 alignment problems, e.g., stage 14 tilt. By comparing the AOIs measured at different locations (e.g., the grid of FIG. 3) on stage 14 to the defined AOI, alignment monitoring unit 28 may determine stage 14 alignment problems at the different locations. In addition, the AOIs measured at different locations of stage 14 may be compared with one another to determine the tilt of stage 14. For example, alignment monitoring unit 28 may use the embodiments of calibration target 16 shown in FIGS. 4A and 4B to efficiently detect the differences in AOIs throughout surface 38 (FIG. 4A) of stage 14.

Figure 9:
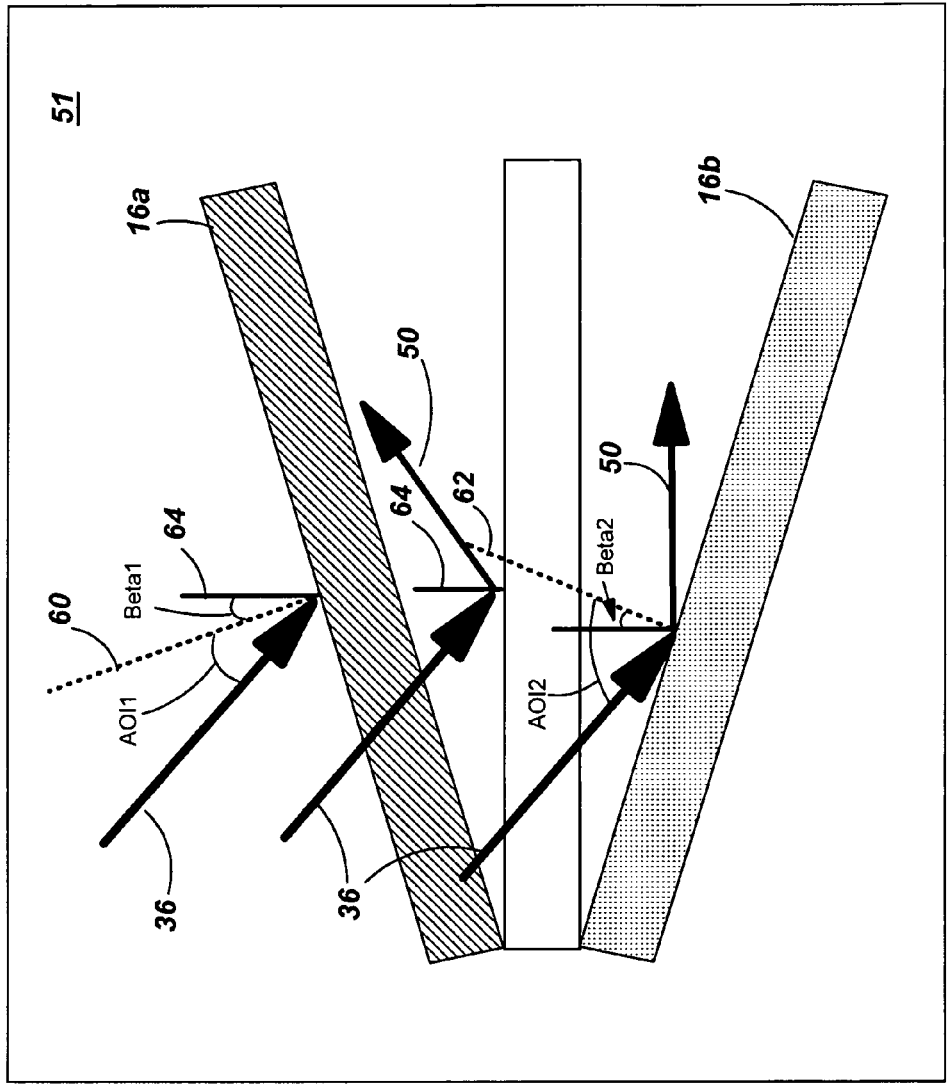
FIG. 9 shows angles of incidence with stage and/or calibration target tilts in the plane of incidence.

Further, it has to be noted that stage 14 tilt results in a reorientation of the surface normal and consequently a rotation of the plane of incidence. The rotation of the plane of incidence can be modeled using the Euler angle transformation matrix. Using a Euler angle transformation matrix, it is possible to quantify all the three Euler angles and hence the stage 14 position relative to an ideal condition of stage 14.

Where separated calibration target 16 is used in the AOI measurement, the positioning of calibration target 16, e.g., calibration target 16 tilt, may also contribute to the difference between the measured AOI and the defined AOI. As such, according to an embodiment, alignment monitoring unit 28 may further reduce/eliminate the contribution of calibration target 16 to the measured AOI. For example, calibration target 16 may be positioned at each stage 14 location, e.g., grid point 14a (FIG. 3), with different orientations/tilts, and alignment monitoring unit 28 may analyze the measured AOI, with the different calibration target 16 orientations to separate the contribution of calibration target 16 to the measured AOI from the contribution of stage 14. FIG. 9 shows target 16 with two tilts 16a, 16b, e.g., notch up and notch down. Assuming calibration target 16 tilts are within plane of incidence 51, the contribution of stage 14 and calibration target 16 may be determined using the following equations:

$$Q_{max} = \text{Max}(AOI_1, AOI_2) = \Psi + \beta_2,$$

$$Q_{min} = \text{Min}(AOI_1, AOI_2) = \Psi - \beta_1,$$

$$\beta_1 = \beta_s + \beta_w,$$

$$\beta_2 = \beta_s - \beta_w,$$

$$\beta_w = \Psi - (Q_{max} + Q_{min})/2,$$

$$\beta_s = (Q_{max} - Q_{min})/2,$$

where $\beta_w$ denotes an angle induced by calibration target 16, $\beta_s$ denotes an angle induced by stage 14, $AOI_1$, $AOI_2$ denote measured AOIs with two calibration target 16 orientations/tilts 16a, 16b, respectively, $\beta_1$, $\beta_2$ denote the angles between the actual surface normal 60, 62 for calibration tilts 16a, 16b, respectively, and the ideal surface normal 64, as shown in FIG. 9 ("Beta" is used in FIG. 9 for β), and $\Psi$ denotes a defined AOI (defined by, e.g., the manufacturer of tool 12). After the contribution of calibration target 16 ($\beta_w$) is determined and eliminated, alignment monitoring unit 28 may use the contribution of stage 14, i.e., $\beta_s$, to monitor the alignment of stage 14. Note that this is a special case with the calibration target 16 and stage 14 tilts in plane of incidence 51. For a more general case where the tilts are outside plane of incidence 51, a Euler algorithm may be used to separate the contribution of calibration target 16 and stage 14.

In process S4, calibration unit 30 calibrates stage 14 based on the measured angle of incidence. For example, calibration unit 30 may adjust stage 14 such that the measured AOI conforms to the defined AOI. For another example, calibration unit 30 may adjust stage 14 such that AOIs measured at different locations on stage 14 substantially conform to one another.

It should be appreciated that the above described processes may be conducted for various purposes and at various stages of a processing system. For example, the above processes may be conducted for calibrating stage 14, which is relatively less frequent. The above processes may also be conducted to update stage 14 alignment information before, during, and after the measurement of each wafer (each different type of wafer). The determined AOIs and stage 14 alignment information may be fed forward, fed back, or considered substantially real time in the measurements of wafers by tools 12.

While shown and described herein as methods, calibration targets, and stages for monitoring a stage alignment in a processing system, it is understood that the disclosure further provides various alternative embodiments. For example, in an embodiment, the disclosure provides a program product stored on a computer-readable medium, which when executed, enables a computer infrastructure to monitor a stage alignment in a processing system. To this extent, the computer-readable medium includes program code, which may be installed to a computer system, e.g., processing system 20 (FIG. 1), to implement the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as a memory and/or a storage system and/or as a data signal traveling over a network (e.g., during a wired/wireless electronic distribution of the program product).

It should be appreciated that the teachings of the present disclosure could be offered as a business method on a subscription or fee basis. For example, a system 10 (FIG. 1) including processing system 20, a calibration target 16 (FIGS. 4A and 4B) and/or a stage 14 (FIGS. 5 and 6) could be created, maintained and/or deployed by a service provider that offers the functions described herein for customers. That is, a service provider could offer to monitor a stage alignment in a processing system as described above.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A method for monitoring a stage alignment in a processing system, the method comprising:
    providing a calibration target on a surface of the stage, the calibration target having:
        an upper surface including a portion sensitive to a change of an angle of incidence of a light beam striking on the portion;
        a lower surface which when interfacing with a surface of an object, translates a shape of the object surface into a relative position of the sensitive portion to the light beam; and
        a cut-off portion between the upper surface and the lower surface, the cut-off portion substantially perpendicular to the surface of the stage,
        wherein the sensitive portion of the upper surface includes one of a convex portion or a concave portion;
    measuring an angle of incidence of the light beam to the calibration target; and
    monitoring the stage alignment based on the determined angle of incidence.

2. The method of claim 1, wherein the providing includes positioning the calibration target at a same location on the surface with different tilts.

3. The method of claim 1, wherein the providing includes providing the calibration target at different locations of the surface to measure the angle of incidence thereto.

4. The method of claim 3, wherein the different locations constitute a grid throughout the surface.

5. The method of claim 1, wherein the providing includes embedding the calibration target in the stage.

6. The method of claim 5, wherein the embedding includes embedding a substantially ring-shaped calibration target around a center of the surface.

7. The method of claim 5, wherein the embedded calibration target includes one of a reflective material or a transparent material, and the measuring includes detecting at least one of a direction and an optical property of one of a reflected beam from the embedded calibration target or a pass through beam through the embedded calibration target.

8. The method of claim 1, wherein the monitoring includes at least one of comparing the measured angle of incidence to a defined angle of incidence and comparing the measured angle of incidence with other angles of incidence measured at different locations on the stage.

9. The method of claim 1, wherein the monitoring includes eliminating a contribution of the calibration target to the measured angle of incidence.

10. The method of claim 1, further comprising calibrating the stage based on the measured angle of incidence.

11. The method of claim 1, wherein the upper surface includes materials of different optical responses at different surface locations thereof, wherein a change in the angle of incidence of the light beam causes the light beam to intersect a different material at a different surface location indicating the change in the angle of incidence.

12. A stage in a processing system, the stage comprising:
    a calibration target embedded in the stage, the calibration target including:
        an upper surface including a portion sensitive to a change of an angle of incidence of a light beam striking on the portion;
        a lower surface which when interfacing with a surface of an object, translates a shape of the object surface into a relative position of the sensitive portion to the light beam and
        a cut-off portion between the upper surface and the lower surface, the cut-off portion substantially perpendicular to the surface of the stage.

13. The stage of claim 12, further including multiple calibration targets embedded at different locations on the surface of the stage.

14. The stage of claim 13, wherein the calibration target is substantially ring-shaped.

15. The stage of claim 12, wherein the surface of the embedded calibration target is at least one of lower than the surface of the stage and covered by a protective transparent cover.

16. The stage of claim 12, wherein the calibration target includes one of a reflective material or a transparent material.

17. A calibration target comprising:
    an upper surface including a portion sensitive to a change of an angle of incidence of a light beam striking on the portion;
    a lower surface which when interfacing with a surface of an object, translates a shape of the object surface into a relative position of the sensitive portion to the light beam; and
    a cut-off portion between the upper surface and the lower surface the cut-off portion substantially perpendicular to the surface of the stage,
    wherein the sensitive portion of the upper surface includes one of a convex portion or a concave portion.

18. The calibration target of claim 17, wherein the upper surface includes materials of different optical responses at different surface locations thereof, wherein a change in the angle of incidence of the light beam causes the light beam to intersect a different material at a different surface location.

19. A system for monitoring a stage alignment in a processing system, the system comprising:
    a calibration target capable of being positioned on a surface of the stage, the calibration target having:
        an upper surface including a portion sensitive to a change of an angle of incidence of a light beam striking on the portion;
        a lower surface which when interfacing with a surface of an object, translates a shape of the object surface into a relative position of the sensitive portion to the light beam; and a cut-off portion between the upper surface and the lower surface, the cut-off portion substantially perpendicular to the surface of the stage,
wherein the sensitive portion of the upper surface includes one of a convex portion or a concave portion;
an angle of incidence mechanism configured to measure an angle of incidence of the light beam to the calibration target; and
an alignment monitoring unit configured to monitor the stage alignment based on the determined angle of incidence measured by the angle of incidence mechanism.

* * * * *